United States Patent
Becker

(10) Patent No.: US 8,006,066 B2
(45) Date of Patent: Aug. 23, 2011

(54) METHOD AND CIRCUIT CONFIGURATION FOR TRANSMITTING DATA BETWEEN A PROCESSOR AND A HARDWARE ARITHMETIC-LOGIC UNIT

(75) Inventor: Burkhard Becker, Ismaning (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1714 days.

(21) Appl. No.: 10/730,619

(22) Filed: Dec. 8, 2003

(65) Prior Publication Data

US 2004/0143722 A1    Jul. 22, 2004

Related U.S. Application Data

(63) Continuation of application No. PCT/DE02/02063, filed on Jun. 6, 2002.

(30) Foreign Application Priority Data

Jun. 6, 2001 (DE) .................................. 101 27 348

(51) Int. Cl.
    *G06F 13/12* (2006.01)
(52) U.S. Cl. .............................. 711/220; 700/24; 710/1
(58) Field of Classification Search .................. 711/220; 700/24; 710/1
See application file for complete search history.

(56) References Cited

U.S. PATENT DOCUMENTS

| | | | | |
|---|---|---|---|---|
| 3,833,888 | A | * | 9/1974 | Stafford et al. .................... 710/1 |
| 4,405,980 | A | * | 9/1983 | Hess ............................... 700/24 |
| 5,150,471 | A | * | 9/1992 | Tipon et al. ..................... 711/220 |
| 5,311,523 | A | * | 5/1994 | Serizawa et al. ............... 714/794 |
| 5,537,445 | A | | 7/1996 | Blaker et al. |
| 5,539,780 | A | | 7/1996 | Dutkiewicz |
| 5,905,757 | A | | 5/1999 | Kundmann et al. |
| 6,195,782 | B1 | | 2/2001 | Rahmatullah et al. |
| 6,310,891 | B1 | * | 10/2001 | Dove et al. ..................... 370/470 |
| 6,363,119 | B1 | * | 3/2002 | Oami ......................... 375/240.03 |

FOREIGN PATENT DOCUMENTS

| EP | 0 590 597 A2 | 4/1994 |
|---|---|---|
| EP | 0 899 887 A2 | 3/1999 |

* cited by examiner

*Primary Examiner* — Yong Choe
(74) *Attorney, Agent, or Firm* — Laurence A. Greenberg; Werner H. Stemer; Ralph E. Locher

(57) ABSTRACT

A method for transmitting data of a plurality of data types between a digital processor and a hardware arithmetic-logic unit with at least one associated table memory, first involves preselecting a base address in the table memory that (base address) is dependent on the data type of the data to be transmitted. This is followed by a read and/or write access to the table memory by taking the preselected base address as a starting point for computing the address used for the read/write access in the table memory for each access operation according to an arithmetic computation rule.

22 Claims, 3 Drawing Sheets

METHOD AND CIRCUIT CONFIGURATION FOR TRANSMITTING DATA BETWEEN A PROCESSOR AND A HARDWARE ARITHMETIC-LOGIC UNIT

CROSS REFERENCE TO RELATED APPLICATION

This application is a continuation of copending International Application No. PCT/DE02/02063, filed Jun. 6, 2002, which designated the United States and was not published in English.

BACKGROUND OF THE INVENTION

Field of the Invention

The invention relates to a method and a circuit for transmitting data between a processor and a hardware arithmetic-logic unit, particularly a Viterbi hardware arithmetic-logic unit.

In many digital data transmission situations, data need to be interchanged bidirectionally between a processor and a hardware circuit that supports the processor. In this context, the following aspects are usually of significance: The data transfer, controlled by the processor, between the processor and the hardware circuit may not use any significant share (as a percentage) of the available processor power, even at high data rates. In addition, rapid data transmission is frequently demanded. Another important aspect is often seen as being that the data transmission needs to be as compatible as possible with different data structures (e.g. different data types, word lengths etc.). In addition, universal methods are required for the data transmission, i.e. methods that are also intended to be able to be used for different designs of hardware circuits. Finally, the hardware complexity for implementing a method which meets these requirements needs to be kept down.

One important area of application in which all of the cited requirements become noticeable is the area of mobile radio. In mobile radio receivers, computation methods that are based on the Viterbi algorithm are used both for equalizing the received signals and for channel decoding. The Viterbi algorithm is a recursion method whose computation sequences are repeated time step by time step. Particularly at high data rates, when using relatively high-level modulation methods, when taking a long channel memory as a basis for equalization or else when using low code rates for the channel coding and in many other situations, execution of the Viterbi algorithm can become very computation-intensive.

The easiest option, in terms of system technology, for executing the Viterbi algorithm is to execute it using just one suitably programmed processor. A drawback of this solution, however, is that high-performance and therefore expensive processors are required whose computation power is of the order of magnitude of at least 400 MIPS (Million Instructions per Second). Added to this is the fact that such processors draw a large amount of current, which is why they cannot be used in mobile telephones in practice on account of the limited energy resources in mobile telephones.

It is has therefore already been proposed to relieve the burden on the processor by adding a Viterbi hardware circuit. In particular, it is already known practice to execute the computation-intensive ACS (Add Compare Select) operations using such a Viterbi hardware circuit, i.e. to "relocate" them from the processor. Such hardware circuits are frequently referred to as hardware supports or hardware accelerators in the literature.

The book "Halbleiterschaltungstechnik" [Semiconductor circuitry], by U. Tietze and Ch. Schenk, 10th Edition, 1993, Springer Verlag, Berlin, describes the operation of a RAM as a shift register on pages 284 and 285, Section 11.2.2. In this case, the access address of the shift register is generated by a counter.

Published European Patent Application EP 0 899 887 A2 describes a circuit for a Viterbi decoder with low power consumption. The circuit includes arithmetic units and memories for buffer-storing intermediate results computed in the arithmetic units. The specification gives no indication of how this circuit interacts with a DSP (digital signal processor) or is programmed by the DSP.

Another arithmetic unit for performing Viterbi decoding is described in Published European Patent Application EP 0 590 597 A2. Intermediate results, including various data types, computed by the arithmetic unit are stored in buffer-storage devices provided for the purpose. This specification reveals nothing in relation to the transmission of data between the Viterbi unit and the DSP.

SUMMARY OF THE INVENTION

It is accordingly an object of the invention to provide a circuit configuration and a method for transmitting data between a digital processor and a hardware arithmetic-logic unit, which overcome the above-mentioned disadvantages of the prior art circuit configurations and methods of this general type.

In particular, it is an object of the invention to provide a method for transmitting data between a digital processor and a hardware arithmetic-logic unit, particularly a Viterbi hardware arithmetic-logic unit, which can be used advantageously with regard to the cited requirements. In particular, it is an object of the invention to provide a circuit configuration or interface having these properties for data interchange between a processor and a hardware arithmetic-logic unit.

With the foregoing and other objects in view there is provided, in accordance with the invention, a circuit configuration including a hardware arithmetic-logic unit which has at least one associated table memory. Data including a plurality of data types (e.g. reception symbols, channel coefficients, soft output values, trace back data symbols etc. in the case of a Viterbi arithmetic-logic unit) need to be stored in the table memory. In this case, the processor's read and/or write access to the table memory includes the steps of preselecting a base address which is dependent on the data type of the data which are to be transmitted and accessing the table memory by taking the preselected base address as a starting point for computing, according to a prescribed arithmetic computation rule in hardware, a plurality of addresses used for read and/or write access operations in the table memory for consecutive access operations.

The effect achieved by associating base addresses with data types is that the table memory is partitioned such that data of different data types can be stored in different memory subareas. When the digital processor accesses the table memory, the memory subarea reserved for the corresponding data type is addressed using the preselection of its base address. Since the subsequent memory access operations involve performing the addressing by computing the addresses in hardware, this addressing can be performed quickly and without any computation complexity for the processor.

It will be pointed out that the invention relates to the transmission of data between the digital processor and the hardware arithmetic-logic unit, but not the hardware arithmetic-logic unit's internal access operations to the table memory. The interaction between the hardware arithmetic-logic unit and the table memory (i.e. the hardware arithmetic-logic unit's access control to the table memory) is dependent on the implementation, or on the algorithm prescribed by the implementation, of the hardware arithmetic-logic unit and is of no significance to the invention.

Preferably, the arithmetic computation rule for computing the addresses in the table memory is an incrementation or decrementation rule. In this case, the table memory is operated in the manner of a shift register or FIFO in each of the memory subareas, with the data in this case not being shifted, unlike in an ordinary shift register, but instead the address, which acts as a pointer to the clearly defined data, is counted.

Preferably, the base addresses associated with the different data types are stored in a base address register, and a base address is preselected by setting a selection bit associated with this base address using the processor. The address pointer thus automatically jumps to the preset base address as soon as the processor sets the corresponding selection bit. In this case, the processor also no longer has the complexity of generating base addresses.

In line with a first preferred method variant, the base addresses are prescribed unalterably or in hardwired form in hardware. The table memory is thus present in a firmly prescribed configuration.

One alternative variant embodiment of the inventive method is characterized in that the base addresses can be programmed by the digital processor. In this case, there is the opportunity for flexible programming of the hardware support including the hardware arithmetic-logic unit and the table memory by the processor, which can be advantageous, particularly when using different mobile radio standards or modulation methods.

If the hardware support can be flexibly programmed by the digital processor, provision is preferably made for the digital processor to be able to program information relating to the number of data items which are written to or read from the memory subareas (T1_RAM1, ..., T0_RAM2, ..., T0_RAMW1, ..., T0_RAMW2) associated with the respective base addresses (BA0, BA1, ..., BAn) and/or information about the block size of data blocks and/or information about the decoding rate and/or information about the convolution polynomials used in the channel coding. This allows the hardware arithmetic-logic unit to be informed about how the data written to the table memory by the processor need to be used or processed.

Another advantageous measure in the inventive method is characterized by selection of a packing mode which causes a plurality of data words output by the processor for write access to be combined to form a "packed" memory data word for the table memory, and/or by the selection of an unpacking mode which causes a memory data word read from the table memory upon read access to be broken down into a plurality of data words before input into the processor. In this way, it is possible to achieve alignment of the word length of the specific data type with the prescribed word length in the table memory, i.e. in the case of a data type having a relatively short word length, for example, it is possible to accommodate a plurality of words per memory address in the table memory. This first allows better use of storage space and second—if desired—multiple access to a plurality of data words by the hardware circuit is supported. The unpacking mode allows "packed" memory data words to be split into the original data words again, so that the processor (which has a firmly prescribed input word length) can process the data words. The data words can in turn be packed and unpacked without involving the processor.

One important area of application for the present invention is characterized in that the arithmetic-logic unit is a Viterbi hardware arithmetic-logic unit (e.g. for channel decoding or for equalization).

An inventive circuit configuration for transmitting data including a plurality of data types between the processor and the hardware arithmetic-logic unit provides an input and/or output memory which the processor accesses for data input/output with the prescribed address. The measures already described in connection with the inventive method use a base address memory device (which is, in particular, a base address register arranged outside the processor) and a hardware address computation circuit, which is a counting device, in particular, to generate the access address for the table memory without involving the processor. The data word which is in the input and/or output memory is then stored in the table memory at this address. The method allows a high data rate, since the processor can access the input and/or output memory without any waiting cycles, i.e. at the system clock rate.

It will be pointed out that the input and/or output memory can be used to write to or read all the hardware memory subareas using just a single fixed address without this requiring a multiplicity of internal addresses to be computed in the processor. If two hardware arithmetic-logic units (one for equalization and one for channel decoding) are provided, then there are preferably two input and/or output memories, i.e. the processor's access operations to all the equalizer and decoder hardware require just two fixed addresses which are known to the processor.

In the case of flexible programming of the hardware, one advantageous variant embodiment of the inventive circuit configuration is characterized by a configuration memory which stores information about the number of data items which are written to or read from the memory subareas associated with the respective base addresses and/or information about the block size of data blocks and/or information about the decoding rate and/or information about the convolution polynomials used in the channel coding. These configuration data notify the hardware arithmetic-logic unit of the association and use of the data which the digital processor writes to the memory subareas associated with the respective base addresses and which the digital processor reads from the memory subareas associated with the respective base addresses. Other features which are considered as characteristic for the invention are set forth in the appended claims.

Although the invention is illustrated and described herein as embodied in a method and circuit configuration for transmitting data between a processor and a hardware arithmetic-logic unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
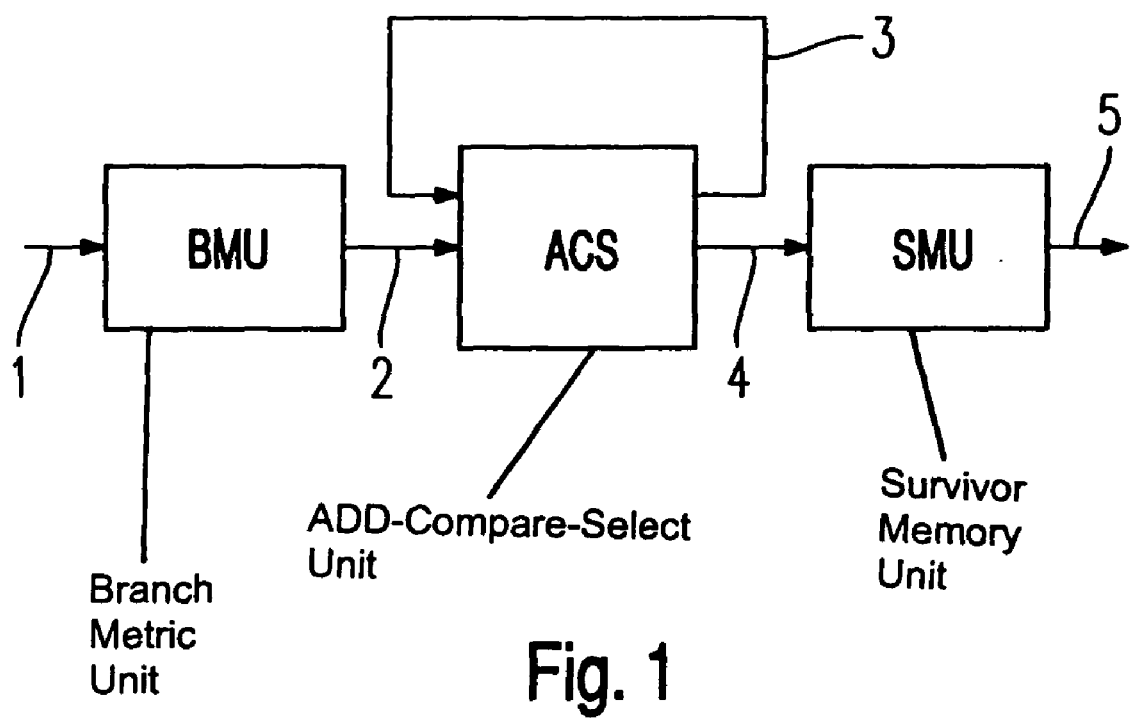
FIG. 1 is a general block diagram of a circuit for performing Viterbi computations.

Referring now to the figures of the drawing in detail and first, particularly, to FIG. 1 thereof, there is shown the general design of a Viterbi computation unit including a Branch Metric Unit BMU for computing branch metrics, an ACS (add-compare-select) unit for performing ACS operations, and a Survivor Memory Unit SMU for performing trace back operations for the ascertained paths. A Viterbi computation unit having the structure shown is used both in equalizers (data detectors) and in channel decoders.

The general way in which Viterbi computation units work is known and is explained here very briefly:

Generally, Viterbi computation is based on the idea of using an alternative method to ascertain a shortest path through a state diagram ("trellis diagram") showing the states of a shift register over time. In the case of equalization, the shift register represents the channel memory, whereas in the case of channel decoding the channel coder's shift register is considered. In both cases, a data unit (in the case of the equalizer: a data symbol; in the case of the coder: a bit) is inserted into the appropriate shift register per time step, and this alters the state of the shift register. The values of the data units which are supplied to the respective shift register in each time step are suitable as possible reception values. The likelihood of these data units appearing as reception values is determined time step by time step using Viterbi recursion. In this context, the Branch Metric Unit BMU computes branch likelihoods, referred to as branch metric values, for every possible branch in the (channel coder or equalizer) trellis diagram. The computation of these branch metric values is based on the information which is currently available to the receiver, i.e. on the received data symbols and the channel parameters ascertained by a channel estimator in the case of equalization, and on the soft output values output by the equalizer in the case of channel decoding.

The branch metric values computed in the Branch Metric Unit BMU are supplied to the Add-Compare-Select Unit ACS via the data link 2. In the Add-Compare-Select Unit ACS, the branch metric values are added to the respective state metrics of the precursor states ("ADD" operation) and the sums obtained in this manner are compared ("COMPARE" operation). The branch having a sum, including the branch metric value and the metric for the precursor state, that is minimal is selected ("SELECT" operation) and forms the extension of the path that leads to the precursor state in the target state. These three operations are called ACS operations and are performed by the Add-Compare-Select Unit ACS.

Both the Viterbi equalization and the Viterbi decoding involve cyclically performing the ACS step within each time step, as indicated by the loop 3 in FIG. 1. During each cycle, the ACS operation is executed for a particular group of precursor states and target states, which is referred to as the "Butterfly".

When all of the metrics have been determined in the trellis diagram for a particular time step, the associated state changes are communicated to the Survivor Memory Unit SMU via the data link 4. The Survivor Memory Unit SMU performs a trace back operation in order to ascertain a data bit (channel decoding) or data symbol (equalization) which lies a particular number of time steps in the past. The trace back operation is based on the fact that the individual paths in the trellis diagram converge in a backward direction in time, i.e. the particular data bits/data symbols which have been ascertained for a branch which is further back in the past have a higher level of certainty for surviving paths (whether or not a path survives is actually not discovered until after a particular number of further time steps have been executed).

In the case of channel decoding, the Survivor Memory Unit SMU outputs decoded data bits via the data link 5. In the case of equalization, the data link 5 is used to provide soft output values and hard output values.

Some of the computation steps explained with reference to FIG. 1 are carried out using hardware and some are carried out by a process or using software (firmware). This necessitates interfaces between the hardware and the processor. Depending on the structural design and the requirements, interfaces can exist for all of the data links 1, 2, 3, 4, 5 shown in FIG. 1 and also elsewhere as well.

Figure 2:
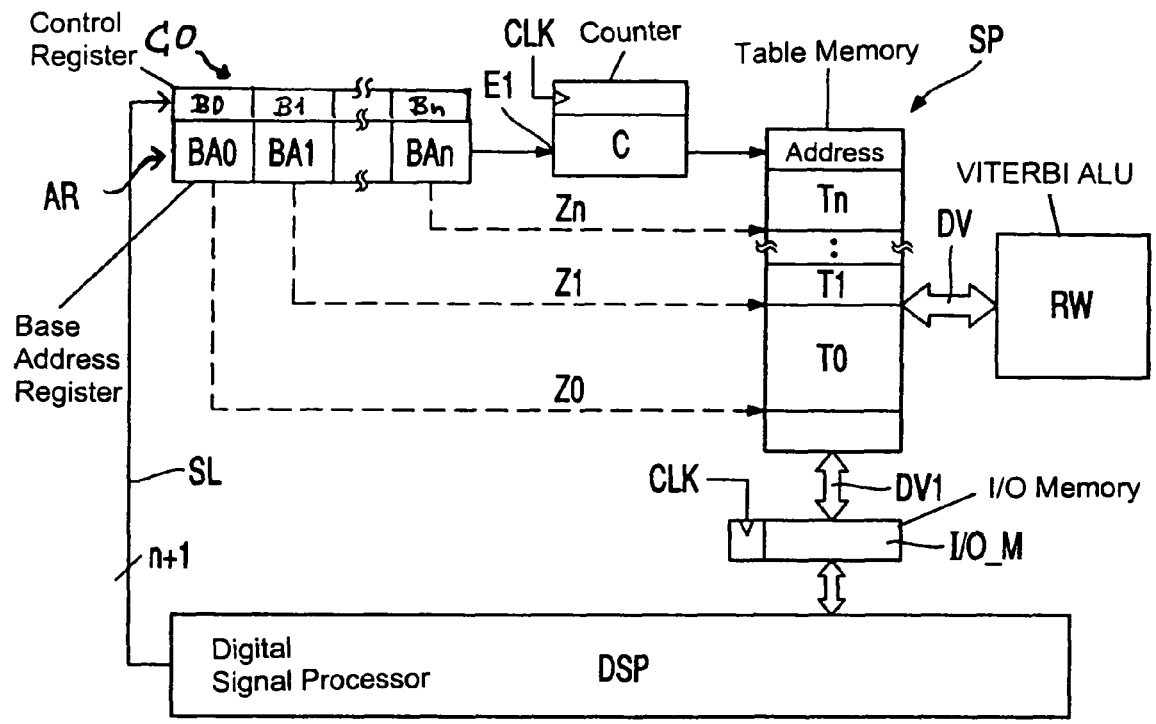
FIG. 2 is a schematic diagram of an inventive circuit configuration.

FIG. 2 uses an example to illustrate the design of an interface in accordance with the invention and also the sequence of data transfer between a digital signal processor DSP and a Viterbi arithmetic-logic unit RW.

The Viterbi arithmetic-logic unit RW produced in the form of hardwired hardware is connected to the data input/output of a table memory SP by a bidirectional data link DV. In addition, the data input/output of the table memory SP is connected to the data input/output of an input/output memory I/O_M by a further data link DV1 for the purpose of data interchange. The input/output memory I/O_M is associated with the digital signal processor DSP and can be addressed by the digital signal processor DSP using a firmly prescribed address. The word length in the input/output memory I/O_M corresponds to the word length in the digital signal processor DSP, e.g. 16 bits.

The table memory SP likewise has a fixed word length, which can be identical to the word length in the input/output memory I/O_M, for example. The address decoder for the table memory SP is actuated using a counter C. The counter C has a setting input E1 which can be used to set the count value. The counter C is clocked using the system clock CLK.

The setting input E1 of the counter C is connected to the output of a base address register AR. The base address register AR stores a plurality of base addresses BA0, BA1 . . . , BAn. To actuate the base address register AR, a control line SL having a word length n+1 is provided. Using the control line SL, the digital signal processor DSP is able to set a respective selection bit B0, B1, . . . , Bn in a control register CO for the purpose of specifically preselecting one of the base addresses BA0, BA1, . . . , Ban stored in the base address register AR and hence to supply it to the setting input E1 of the counter C. The base addresses BA0, BA1, . . . , BAn are predefined addresses in the table memory SP, which prescribe a functional partitioning of the memory subarea in the table memory SP into various subareas T0, T1, . . . , Tn.

The base addresses BA0, BA1, . . . , BAn are either firmly prescribed by hardwiring or can be programmed directly by the digital signal processor DSP, and hence can be changed, if the table memory SP is flexibly configurable.

The text below explains the action of the illustrated interface for the example of a Viterbi equalizer. In this case, the interface will (likewise just for the purposes of illustration) be arranged between the digital signal processor DSP and the Viterbi arithmetic logic unit RW for the data links 1, 5.

The Viterbi arithmetic-logic unit RW in this case computes the branch metrics, the ACS operations and the trace back operations. The data types below need to be transmitted between the digital signal processor DSP and the Viterbi arithmetic-logic unit RW before or after a computation operation in the Viterbi arithmetic-logic unit RW.

1. Input data for the Viterbi arithmetic-logic unit RW:
   reception symbols $x_K$ (k denotes the time step)
   channel coefficients $h_0, \ldots, h_m$; or products of the channel coefficients and of the values of the symbol alphabet; or partial sums of such products (m denotes the length of the channel memory)
   initialization values for state metrics and state vectors
2. Output data for the Viterbi arithmetic-logic unit RW:
   hard output values (i.e. the trace back values)
   soft output values In a first step, the input data values are loaded into the table memory SP by the digital signal processor DSP. For each data type, one memory subarea is used. By way of example, the reception symbols $x_k$ are first written to the memory subarea T0. For this purpose, the digital signal processor DSP notifies the base address register AR, by setting the corresponding selection bit B0, that the data type "reception data symbols" needs to be transmitted. This data type has the associated base address BA0. Setting the corresponding selection bit B0 prompts the address pointer to jump to the position Z0 shown in FIG. 2.

In a subsequent command step, the system clock CLK is applied to the clock input of the counter C and at the same time the reception symbols $x_k$ are conveyed to the input/output memory I/O_M by the digital signal processor DSP at the system clock rate. The reception symbols $x_k$ are written to the input/output memory without any wait states when using the prescribed address of the input/output memory I/O_M, which address is always the same.

The address computation by the counter C is thus activated just when the digital signal processor DSP accesses the input/output memory I/O_M.

The data word buffer-stored in the input/output memory I/O_M is written to the table memory SP at the preselected address via the data link DV1. Provided that no packing mode is chosen (this can be the case with an identical word length in the table memory SP and the data word, for example), precisely one data word is stored in each system clock cycle CLK.

The partitioning of the table memory SP prescribes the maximum number of each data type's data words which can be stored in a computation operation. When the reception symbols $x_k$ have been stored in the table memory SP, there is a change to the next data type by virtue of the digital signal processor DSP using the control line SL to preselect the next base address, e.g. BA1, by setting the appropriate selection bit. The address pointer then jumps to the position Z1 (i.e. the lowest address in the memory subarea T1) and the digital signal processor's DSP data transmission to the table memory SP is continued for the second data type in the same way.

As soon as all of the data words required for a computation operation in the Viterbi arithmetic-logic unit RW have been entered into the table memory SP, i.e. the table memory is fully "loaded", the Viterbi arithmetic-logic unit RW starts to execute the appropriate computation operations. The arithmetic-logic unit RW is produced using sequential logic and therefore allows the computation steps to be performed quickly and in an energy saving manner. During the computation operation, data required for the computation are constantly retrieved from the individual memory subareas, and result data are written to further memory subareas (e.g. T2 to Tn) in the table memory SP which are provided for this purpose. These access steps are not time critical, since they are performed in parallel with the execution of computation steps in the arithmetic-logic unit RW.

When the computation operation, which preferably extends over a multiplicity of time steps k, has ended, all of the input data are processed and the corresponding output data (hard output values and soft output values) are written to the table memory SP. The Viterbi arithmetic-logic unit RW changes over to a wait state in which the result data need to be read from the table memory SP by the digital signal processor DSP as quickly as possible. Data are read from the table memory SP in the same way as data are written to the table memory SP. The digital signal processor DSP accesses only the input/output memory I/O_M, and this access is diverted to the memory data word in the table memory SP which has been defined by the base address and the number of access operations which have already taken place.

The change of memory subareas is in turn brought about by preselecting another base address selection bit.

The input/output memory I/O_M can be a processor-internal "user defined register". It is important that the digital signal processor DSP can access this register without any wait states and with a fixed address.

Figure 3:
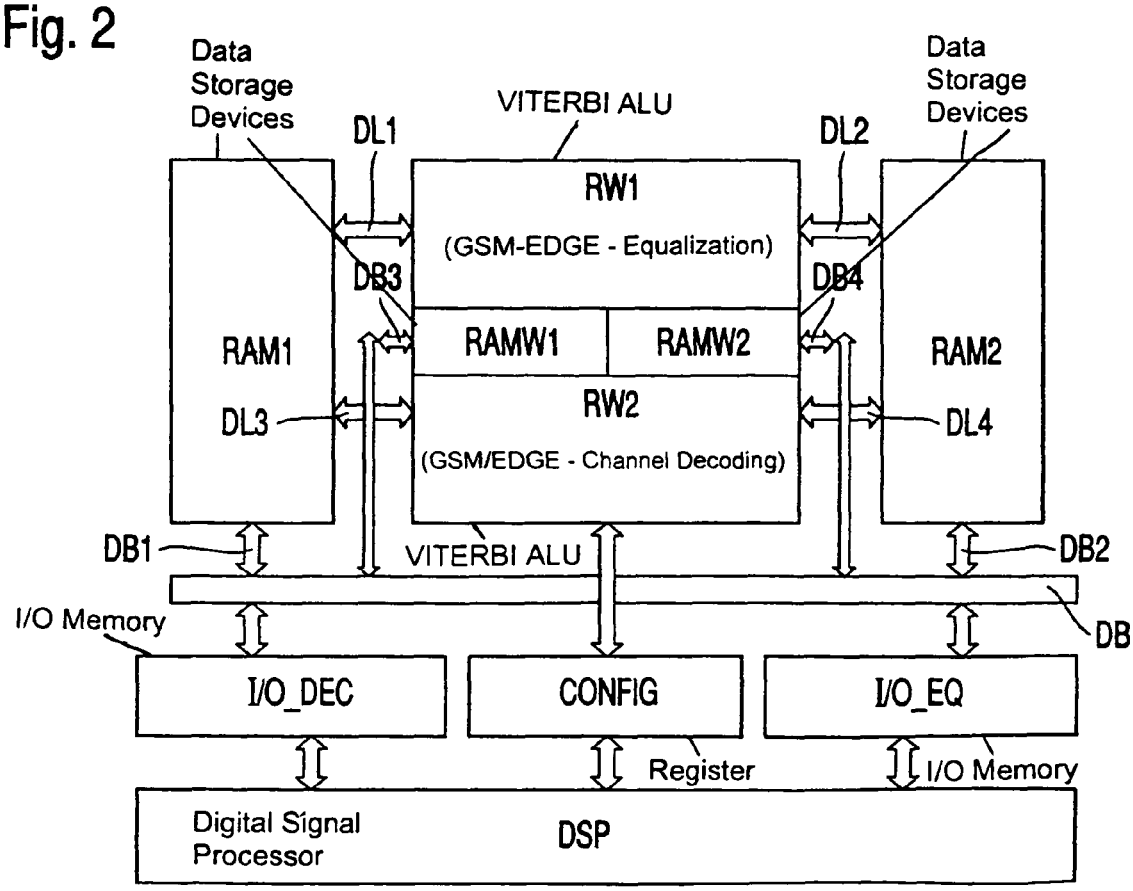
FIG. 3 is a block diagram showing the architecture of an equalizer and a channel decoder circuit that uses the inventive circuit configuration.

FIG. 3 shows the architecture of a receiver circuit having an equalizer and a channel decoder. The receiver circuit uses a digital signal processor DSP and a hardware support, connected to the digital signal processor DSP by an interface in accordance with the invention, for equalizing and decoding. The digital signal processor DSP is connected to Viterbi arithmetic-logic units RW1 and RW2 via one or more configuration registers CONFIG. The first arithmetic-logic unit RW1 is used for equalizing the received data signal, and the second arithmetic-logic unit RW2 performs channel decoding. The arithmetic-logic units RW1 and RW2 can perform equalization and channel decoding both in line with the GSM (Global System for Mobile Communications) standard, for example, and in line with the EDGE (Enhanced Data Services for GSM Evolution) standard.

The first arithmetic-logic unit RW1 is connected to a first volatile data storage device RAM1 via a first bidirectional data link DL1 and to a second volatile data storage device RAM2 via a second bidirectional data link DL2, for the purpose of data interchange. Corresponding third and fourth bidirectional data links DL3 and DL4 are provided between the second arithmetic-logic unit RW2 and the first data storage device RAM1 and between the second arithmetic-logic unit RW2 and the second data storage device RAM2.

The two arithmetic-logic units RW1 and RW2 can also access two volatile data storage devices RAMW1 to RAMW2. As will be explained in more detail, the data storage devices RAMW1 and RAMW2 store intermediate result values which are obtained during the equalization and/or channel decoding in the arithmetic-logic units RW1 and RW2.

The digital signal processor DSP can access all of the aforementioned data storage devices RAM1, RAM2, RAMW1, RAMW2 via data buses DB1, DB2, DB3 and DB4, which are connected to a central data bus DB. Each data storage device RAM1, RAM2, RAMW1, RAMW2 therefore corresponds to the table memory SP shown in FIG. 2, and the data buses DB1, DB2, DB3 and DB4 are respectively comparable to the data link DV1 in FIG. 2. The digital signal processor's DSP access is via two separate input/output memories I/O_DEC and I/O_EQ. These two memories correspond to the input/output memory denoted by the reference symbol I/O_M in FIG. 2. For the digital signal processor's DSP access during a channel decoding operation, the input/output memory I/O_DEC is used, while the input/output memory I/O_EQ is used for the digital signal processor's DSP access during an equalization operation. In this way, it is possible to use one processor to prompt hardware-supported equalization and hardware-supported channel decoding simultaneously. In addition, just two addresses (namely for the input/output memory I/O_DEC and for the input/output memory I/O_EQ) are used to write to and to read all of the hardware memory subareas for the Viterbi-decoder and Viterbi-equalizer applications.

The control register CO can be arranged in the external memory area of the digital signal processor DSP as part of the configuration register CONFIG. The base address register AR associated with the control register CO is likewise located in the digital signal processor's DSP external memory area and has been omitted in FIG. 3. The actuation of the data storage devices RAM1, RAM2, RAMW1 and RAMW2 via associated counters C corresponds to the illustration in FIG. 2 and has likewise been omitted in FIG. 3.

Figure 4:
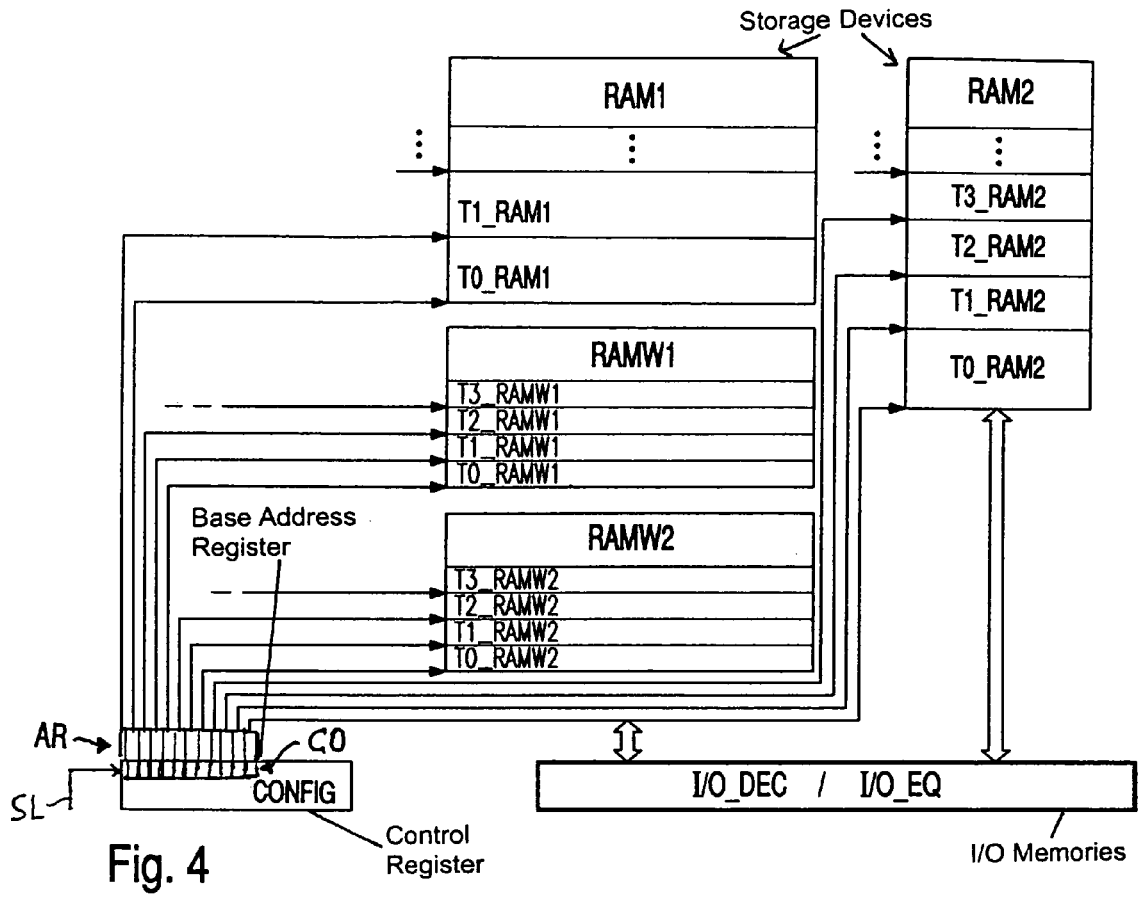
FIG. 4 is a schematic diagram of a memory partition for the equalizer and channel decoder circuit shown in FIG. 3.

In line with FIG. 4, the data storage devices RAM1, RAM2, RAMW1 and RAMW2 can be partitioned into the following memory subareas using the base address register AR (which is hardwired or can be programmed using the digital signal processor DSP):

RAM1 (32-bit word length):
  T0_RAM1 reception data symbol $x_k$ (complex-value)
  T1_RAM1 channel coefficient (complex-value) or products/partial sums for branch metric values
RAM2 (16-bit word length):
  T0_RAM2 trace back values from the decoder
  T1_RAM2 soft input values for decoder
  T2_RAM2 soft output values from the equalizer
  T3_RAM2 hard output values from the equalizer
Data storage device RAMW1 (32-bit word length):
  T0_RAMW1 metrics of the precursor states, decoder
  T1_RAMW1 metrics of the precursor states, equalizer
  T2_RAMW1 paths to precursor states, equalizer
  T3_RAMW1 branch metric values for preceding time step, equalizer
Data storage device RAMW2 (32-bit word length):
  T0_RAMW2 metrics for target states, decoder
  T1_RAMW2 metrics for target states, equalizer
  T2_RAMW2 paths to target states, equalizer
  T3_RAMW2 branch metric values for current time step, equalizer It becomes clear that, as already mentioned, the temporary values stored in the data storage devices RAMW1 and RAMW2 can also be addressed by the digital signal processor DSP. This allows a computation operation (decoding and/or equalization) to be interrupted by another process and allows the interrupted computation operation to be continued when the interrupting process has ended.

Besides the control register CO for preselecting the base addresses, the configuration register CONFIG can contain further configuration information for configuring the hardware arithmetic-logic units RW1 and RW2. By way of example, this configuration information includes:
  information about the block size of the arithmetic-logic unit RW2 (Viterbi decoder);
  information about the decoding rate for the arithmetic-logic unit RW2;
  information about the convolution polynomials used for the arithmetic-logic unit RW2; and
  information about the size of the subsegments to be equalized for reception data symbols $x_k$ for the arithmetic-logic unit RW1 etc.

The configuration information is used to notify the hardware arithmetic-logic units RW1 and RW2 of details about the processing and use of the data written to the memory subareas. Such information about the use of the data written to the memory subareas by the digital signal processor DSP relates, by way of example, to:
  the size of the memory subarea T1_RAM2 for the soft input values for the decoder;
  the size of the memory subarea T0_RAM2 for the trace back values from the decoder which are read by the digital signal processor DSP;
  the allocation of memory locations in the memory subarea T1_RAM2 for the soft input values for the decoder: two or three or four soft input values per unit time can appear;
  the allocation of memory locations in the memory subarea T0_RAM2 for the trace back values computed by the decoder: sixteen (GSM) or sixty four (EDGE) states per unit time may need to be taken into account;
  the use of the channel coefficients stored in the memory subarea T1_RAM1 and also possibly of products/partial sums of channel coefficients by the hardware arithmetic-logic unit RW1;
  the size of the memory subarea T2_RAM2 for the soft output values from the equalizer; and
  the size of the memory subarea T3_RAM2 for the hard output values from the equalizer etc.

The configuration data written to the configuration memory CONFIG do not just relate to the write operation (i.e. the transmission of data from the digital signal processor DSP to the hardware arithmetic-logic units RW1, RW2), but rather there is also appropriate support for the memory subareas provided for performing the digital signal processor DSP read access. In this case, the digital signal processor DSP uses the configuration data written to the configuration register CONFIG to define, by way of example, the quantity of intermediate results which are to be read by the digital signal processor DSP during a read operation and possibly other configuration information relating to the DSP's processing of the data which are computed in the hardware arithmetic-logic units RW1, RW2 and are stored in the respective memory subareas.

Another aspect of the invention takes into account the fact that the data types which are to be transmitted can have different word lengths and a real or complex-value value range (in the latter case, two data words are required for one size), i.e. generally, are coded using the different number of bits. On the other hand, the aim is advantageously to use inexpensive standard memories having a firmly prescribed word length for a memory data word. To achieve the best possible utilization of memory space, it is possible to pack the data which are to be transmitted (e.g. one, two or three data words) into a word length which is prescribed by the data storage device. In addition, packing supports multiple access by the hardware arithmetic-logic units, e.g. the real and imaginary parts of reception data symbols or else of state metric values for adjacent states can be stored within a memory data word in the data storage device.

Figure 5:
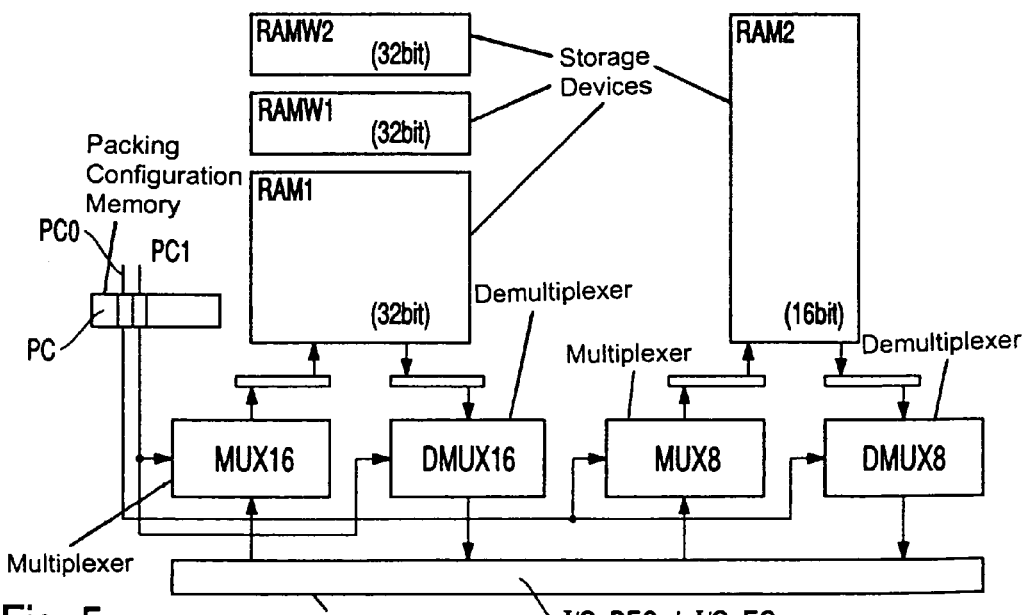
FIG. 5 is a schematic diagram of a variant of the inventive circuit configuration to explain the packing of data words and the unpacking of memory data words.

A packing or unpacking mode can be selected by the digital signal processor DSP in a similar manner to the preselection of the base addresses by setting corresponding selection bits PC0, PC1 etc. in a packing configuration memory PC, see FIG. 5. For this purpose, the area of the data buses DB1-4 (or data link DV1) between the input/output memory I/O_DEC or I/O_EQ and the data storage devices RAM1, RAMW1, RAMW2 with a word length of 32 bits holds the 16-bit multiplexer MUX16 for writing and the 16-bit demultiplexer DMUX16 for reading. The multiplexer MUX16 and also the demultiplexer DMUX16 are each provided with a buffer-store for a 16-bit data word in order, during writing, to combine two 16-bit data words which are output in succession by the digital signal processor DSP to form a 32-bit memory data word, or in order to break down a 32-bit memory data word into two 16-bit data words which are to be processed sequentially by the digital signal processor DSP. Corresponding multiplexers and demultiplexers MUX8 and DEMUX8 with buffer-stores for an 8-bit data word section are arranged in the data bus DB2 for the 16-bit data storage device RAM2. In this case, the packing mode causes two 16-bit data words output by the digital signal processor DSP, which each use just 8 bits (e.g. soft input/output values), to be combined to form a 16-bit memory data word.

When a packing mode is set, the counting clock for the counter C needs to be adjusted appropriately and slowed down with respect to the system clock CLK.

It will be pointed out that the setting of the packing and unpacking modes is not just dependent on the word lengths of the transmitted data words and the word lengths in the memories, but also can be governed by the design and configuration of the Viterbi arithmetic-logic unit RW. By way of example, the number of input data words (soft input values) for a decoder for performing Viterbi recursion is dependent on the code rate chosen at the transmitter end (to be more precise, for a code rate $R_c=1/k$, a number of k soft input values per unit time is required in the decoder). The code rate can be variable depending on the chosen service. A corresponding, code-rate dependent packing rule makes it possible to achieve a situation in which the hardware arithmetic-logic unit RW2 for the channel decoding has to access the appropriate memory subarea just once per time step, even in the case of different code rates. The provision of a packing and unpacking option for data words thus significantly increases the flexibility of the inventive data transmission method, particularly also in respect of the equalization/channel decoding of data signals in different mobile radio standards (for example GSM and EDGE) using the same hardware RW1, RW2.

Finally, it will be pointed out that the digital signal processor DSP hardware interface, described in the present example, for the data links 1 and 5 is just an example and, by way of example, can also be provided in the data links 2, 4. In this case, the branch metric values and the trace back values are computed in the digital signal processor DSP, while a hardware arithmetic-logic unit is used only for performing the ACS operations.

All of the exemplary embodiments described can be combined and they have the common feature that data transmission between a digital processor and a hardware support can always be carried out quickly and with little computation complexity by the processor.

I claim:

1. A method for transmitting data of a plurality of data types between a digital processor and a hardware arithmetic-logic unit, the method which comprises:

associating the hardware arithmetic-logic unit with at least one table memory, the hardware arithmetic-logic unit obtaining data required during a computing operation from at least one component selected from the group consisting of the table memory and the hardware arithmetic-logic unit storing data computed during a computing operation in the table memory;

performing at least one operation selected from the group consisting of reading and writing from the digital processor to the table memory by:

preselecting a base address in the table memory dependent on a data type of data to be transmitted;

computing a plurality of addresses according to a prescribed arithmetic computation rule in hardware by taking the preselected base address as a starting point resulting in a computed plurality of addresses; and accessing the table memory with the digital processor using the computed plurality of addresses for consecutive read access operations or consecutive write access operations in the table memory; and providing the arithmetic computation rule for computing the plurality of addresses in the table memory as an incrementation rule or a decrementation rule.

2. The method according to claim 1, which further comprises:

storing a plurality of base addresses associated with a plurality of different data types in a base address register, the base address that was preselected being one of the plurality of base addresses; and performing the step of preselecting the base address by using the processor to set a selection bit associated with the base address.

3. The method according to claim 2, which further comprises:

prescribing the plurality of base addresses unalterably in hardware, wherein the plurality of base addresses cannot be processed by the digital processor.

4. The method according to claim 1, which further comprises:

programming the base address with the digital processor.

5. The method according to claim 1, which further comprises:

with the digital processor, programming at least one information item selected from a group consisting of information relating to a number of data items being written to or read from a plurality of memory subareas associated with the base address, information about a block size of data blocks, information about a decoding rate, and information about utilized convolution polynomials.

6. The method according to claim 1, which further comprises:

providing a first data type of the plurality of data types as soft input values for channel decoding that are intended for a Viterbi decoder hardware arithmetic-logic unit; and with the digital processor, programming how many soft input values per unit time can be stored in a memory subarea associated with the first data type.

7. The method according to claim 1, which further comprises:

providing a second data type as trace back values computed by a Viterbi decoder hardware arithmetic-logic unit; and with the digital processor, programming how many states the trace back values need to include.

8. The method according to claim 1, which further comprises:

choosing a packing mode causing a plurality of data words, output by the processor for performing the step of accessing the table memory, to be combined to form a memory data word for the table memory.

9. The method according to claim 1, which further comprises:

choosing an unpacking mode causing a memory data word, read from the table memory when performing the step of accessing the table memory, to be broken down into a plurality of data words before being input into the processor.

10. A circuit configuration for transmitting data of a plurality of data types between a processor and a hardware arithmetic-logic unit, comprising:

said processor and said hardware arithmetic-logic unit;

at least one table memory associated with the hardware and arithmetic logic unit, said table memory for providing data to the hardware and arithmetic logic unit required for a computing operation of the hardware and arithmetic logic unit, said table memory for storing data computed in a computing operation of the hardware and arithmetic logic unit;

an input/output memory having a prescribed address used by said processor to access said input/output memory for data input/output;

a base address memory device for storing, for each data type, a base address for said table memory; and a hardware address computation circuit for, taking the base address as a starting point, applying an arithmetic computation rule to produce a plurality of addresses used by the digital processor to consecutively access said table memory;

said arithmetic computation rule being an incrementation rule or a decrementation rule.

11. The circuit configuration according to claim 10, wherein:

said base address memory device is an external base address register designed such that in order to select the base address, said processor sets a selection bit associated with the base address.

12. The circuit configuration according to claim 10, wherein said base address memory device is a read only memory and the plurality of base addresses cannot be processed by the digital processor.

13. The circuit configuration according to claim 10, wherein said base address memory device is a rewritable memory that can be programmed by the digital processor.

14. The circuit configuration according to claim 10, further comprising:

a configuration memory;

said table memory including memory subareas; and said configuration memory for storing information selected from a group consisting of information relating to a number of data items being written to or read from a plurality of said memory subareas associated with the base address, information about a block size of data blocks, information about a decoding rate, and information about utilized convolution polynomials.

15. The circuit configuration according to claim 10, further comprising:

a multiplexer and buffer device for assembling a plurality of data words output by said processor to form a memory data word intended for being stored at an address in said table memory.

16. The circuit configuration according to claim 10, further comprising:

a demultiplexer and buffer device for, before being input into said processor, breaking down a memory data word read from said table memory into a plurality of data words.

17. The circuit configuration according to claim 10, wherein said table memory has a prescribed memory word length.

18. The circuit configuration according to claim 10, wherein:

said hardware arithmetic-logic unit is a Viterbi hardware arithmetic-logic unit.

19. The circuit configuration according to claim 10, wherein:

said hardware arithmetic-logic unit includes an equalizer hardware arithmetic-logic unit and a decoder hardware arithmetic-logic unit;

said processor includes a data transmission connection to said equalizer hardware arithmetic-logic unit; and said processor includes a data transmission connection to said decoder hardware arithmetic-logic unit.

20. The circuit configuration according to claim 10, further comprising:

a hardware counter implementing said arithmetic computation rule as an incrementation rule or a decrementation rule.

21. The circuit configuration according to claim 10, wherein the plurality of base addresses cannot be processed by said processor.

22. The method according to claim 1, which further comprises:

performing the step of providing the arithmetic computation rule by providing a hardware counter that implements the incrementation rule or the decrementation rule.

* * * * *